(12) United States Patent
Matsuura et al.

(10) Patent No.: US 9,941,101 B2
(45) Date of Patent: Apr. 10, 2018

(54) PLASMA PROCESSING APPARATUS AND UPPER ELECTRODE ASSEMBLY

(71) Applicant: TOKYO ELECTRON LIMITED, Tokyo (JP)

(72) Inventors: Shin Matsuura, Miyagi (JP); Jun Young Chung, Gyeonggi-do (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 408 days.

(21) Appl. No.: 14/793,857

(22) Filed: Jul. 8, 2015

(65) Prior Publication Data

US 2016/0013026 A1 Jan. 14, 2016

(30) Foreign Application Priority Data

Jul. 11, 2014 (JP) .................. 2014-143293

(51) Int. Cl.
*H01J 37/32* (2006.01)
*H01L 21/3065* (2006.01)
(Continued)

(52) U.S. Cl.
CPC .. *H01J 37/32532* (2013.01); *C23C 16/45565* (2013.01); *H01J 37/32091* (2013.01); *H01J 37/32568* (2013.01)

(58) Field of Classification Search
CPC ........... H01J 37/32568; H01J 37/32522; H01J 37/32532; H01J 37/32605; H01J 37/32009; H01J 37/32082; H01J 37/32091; H01J 37/32431; H01L 21/67109; H01L 21/67069; C23C 16/45565; Y10T 403/60; Y10T 403/59; Y10T 403/595; Y10T 403/591; Y10T 292/096; B66F 19/00; E04G 11/24
(Continued)

(56) References Cited

U.S. PATENT DOCUMENTS 5,261,434 A * 11/1993 Fodero .................. A45B 3/00
135/16
6,019,060 A * 2/2000 Lenz .................. H01J 37/32623
118/723 R (Continued)

FOREIGN PATENT DOCUMENTS

JP  2010-251752 A  11/2010
JP    3167751 U    5/2011
JP  2011-521472 A   7/2011

*Primary Examiner* — Rakesh Dhingra
*Assistant Examiner* — Laureen Chan
(74) *Attorney, Agent, or Firm* — Rothwell, Figg, Ernst & Manbeck, P.C.

(57) ABSTRACT

A plasma processing apparatus includes supporting members, connecting members and a sliding member. Each of the supporting members is partially disposed in a disc-shaped cooling plate and configured to support an upper electrode in a direction of gravity. Each of the connecting members is partially disposed in the cooling plate and extends in a diametrical direction of the cooling plate to be engaged with the corresponding supporting member. The sliding member is configured to slide the connecting members inward in the diametrical direction of the cooling plate, thereby pushing upward the supporting member and lifting the upper electrode to the cooling plate.

9 Claims, 8 Drawing Sheets

(51) Int. Cl.
*H01L 21/683* (2006.01)
*H05H 1/46* (2006.01)
*C23C 16/455* (2006.01)

(58) Field of Classification Search
USPC ......... 292/123, 299; 118/723 E; 156/345.43, 156/345.44–47
See application file for complete search history.

(56) References Cited

U.S. PATENT DOCUMENTS

| | | | | |
|---|---|---|---|---|
| 8,562,744 | B2* | 10/2013 | Wu | B05B 13/0242 118/715 |
| 2004/0108068 | A1* | 6/2004 | Senzaki | H01J 37/32458 156/345.43 |
| 2007/0125303 | A1* | 6/2007 | Ruby | C23C 14/0021 118/724 |
| 2010/0003824 | A1* | 1/2010 | Kadkhodayan | H01J 37/32091 438/710 |
| 2010/0003829 | A1* | 1/2010 | Patrick | C23C 16/4557 438/758 |
| 2010/0261354 | A1* | 10/2010 | Bettencourt | H01J 37/16 438/710 |
| 2011/0070740 | A1* | 3/2011 | Bettencourt | H01J 37/3244 438/710 |
| 2011/0083809 | A1* | 4/2011 | de la Llera | H01J 37/32091 156/345.34 |
| 2012/0175062 | A1* | 7/2012 | de la Llera | H01J 37/32091 156/345.34 |

\* cited by examiner 202a  202b 202c  202d

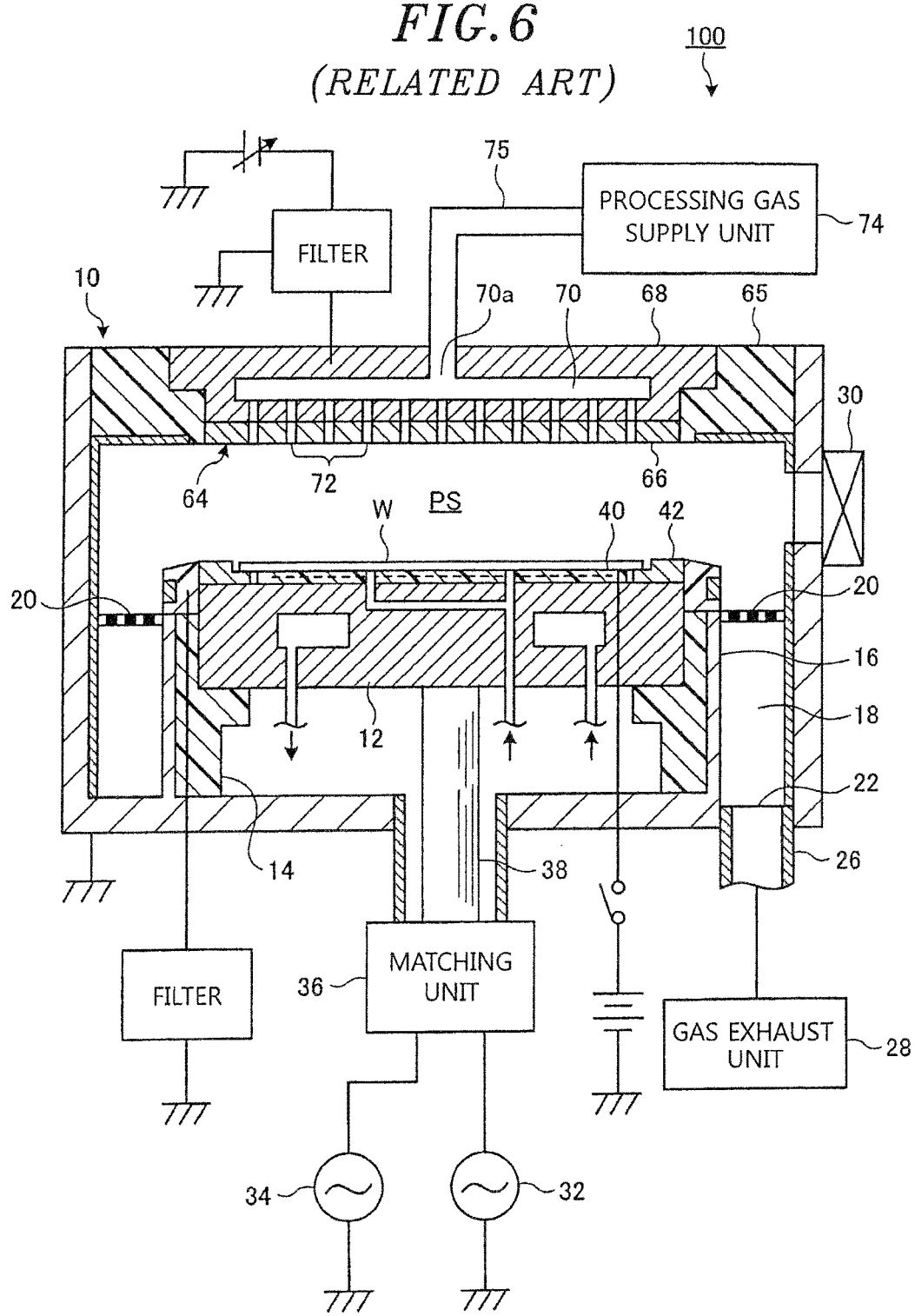

2

PLASMA PROCESSING APPARATUS AND UPPER ELECTRODE ASSEMBLY

CROSS-REFERENCE TO RELATED APPLICATIONS

This application claims priority to Japanese Patent Application No. 2014-143293 filed on Jul. 11, 2014, the entire contents of which are incorporated herein by reference.

FIELD OF THE INVENTION

The disclosure relates to a plasma processing apparatus and an upper electrode assembly.

BACKGROUND OF THE INVENTION

Conventionally, a plasma processing apparatus for performing plasma processing is widely used in a semiconductor manufacturing process such as etching, deposition, oxidation, sputtering or the like.

Generally, a capacitively coupled plasma processing apparatus has a configuration in which an upper electrode and a lower electrode are disposed in parallel to each other in a processing chamber configured as a vacuum chamber. In this configuration, a target substrate (a semiconductor wafer, a glass substrate or the like) is mounted on the lower electrode and a high frequency is applied to one of the electrodes. As a consequence, electrons accelerated by a high frequency electric field generated between both electrodes, secondary electrons emitted from the electrodes, or heated electrons are made to collide with and ionize molecules of a processing gas. As a result, a plasma of the processing gas is generated and a desired fine processing, e.g., an etching process, is performed on a surface of the substrate by radicals or ions in the plasma. In the etching process, there is widely used a dual frequency application type in which a first high frequency power having a relatively high frequency (typically, about 40 MHz or above) for plasma generation (discharge) is applied to the upper electrode or the lower electrode and a second high frequency power having a relatively low frequency (typically about 13.56 MHz or less) for ion attraction to a substrate is applied to the lower electrode. In addition, in the capacitively coupled plasma processing apparatus, there is employed a type in which a plasma is generated between both electrodes by the above-described high frequency discharge and a DC voltage is applied to the upper electrode facing the substrate across the plasma (see, Japanese Patent Application Publication Nos. 2010-251752 and 2011-521472, Japanese Utility Model Registration No. 3167751).

There is proposed a cam lock for mechanically attaching the upper electrode to a receiving plate in the above plasma processing apparatus. In the proposed mechanism, a stud that is press-fitted to a socket above the electrode is engaged with a cam shaft surrounded by a cam bearing in the receiving plate. The cam lock is realized by rotating the cam shaft through an opening formed at an outer peripheral surface of the receiving plate.

However, in such a mechanism, it is difficult to finely control a lifting force of the upper electrode.

SUMMARY OF THE INVENTION

In view of the above, the disclosure provides a plasma processing apparatus and an upper electrode assembly which can finely control a lifting force of an upper electrode.

In accordance with an embodiment of the disclosure, there is provided a plasma processing apparatus including: supporting members each of which is partially disposed in a disc-shaped cooling plate and configured to support an upper electrode in a direction of gravity; connecting members each of which is partially disposed in the cooling plate and extends in a diametrical direction of the cooling plate to be engaged with the corresponding supporting member; and a sliding member configured to slide the connecting members inward in the diametrical direction of the cooling plate, thereby pushing upward the supporting member and lifting the upper electrode to the cooling plate.

BRIEF DESCRIPTION OF THE DRAWINGS

The objects and features of the disclosure will become apparent from the following description of embodiments, given in conjunction with the accompanying drawings, in which:

FIG. 6 shows an example of a configuration of a conventional plasma processing apparatus.

DETAILED DESCRIPTION OF THE EMBODIMENTS

Figure 1:
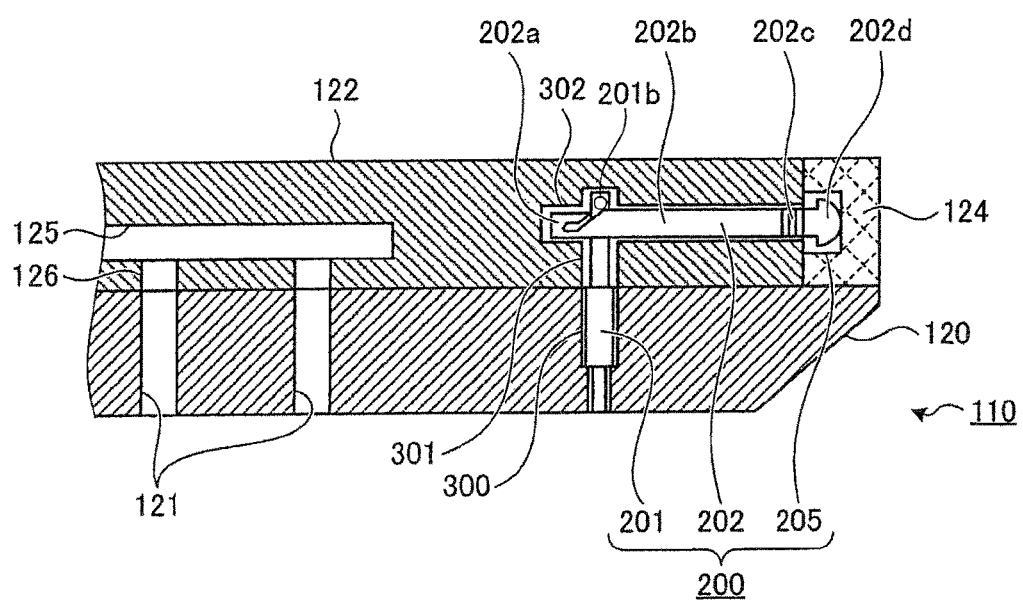
FIG. 1 is a schematic view of an upper electrode assembly of a plasma processing apparatus according to an embodiment.

Hereinafter, embodiments of a plasma processing apparatus and an upper electrode assembly will be described in detail with reference to the accompanying drawings. The disclosure is not limited to those embodiments.

Example of a Conventional Plasma Processing Apparatus

First, an example of a conventional plasma processing apparatus will be described. FIG. 6 shows an example of a configuration of a conventional plasma processing apparatus 100. The plasma processing apparatus 100 is configured as a capacitively coupled plasma etching apparatus including parallel plate-shaped electrodes. The plasma processing apparatus 100 includes a cylindrical chamber (processing chamber) 10 made of a metal such as aluminum, stainless steel or the like.

A circular plate-shaped susceptor 12 for mounting thereon a target substrate, e.g., a semiconductor wafer W, is horizontally provided in the chamber 10 and serves as a lower electrode. The susceptor 12 is made of, e.g., aluminum, and supported by an insulating cylindrical support 14 without being grounded. The cylindrical support 14 is made of, e.g., ceramic, and extends vertically upward from a bottom portion of the chamber 10.

An annular gas exhaust line 18 is formed between an sidewall of the chamber 10 and a conductive cylindrical support 16 extending vertically upward from the bottom portion of the chamber 10 along an outer periphery of the cylindrical support 14. An annular baffle plate 20 is provided at an upstream side or an inlet of the gas exhaust line 18. A gas exhaust port 22 is provided at a downstream side of the gas exhaust line 18.

A gas exhaust unit 28 is connected to the gas exhaust port 22 via a gas exhaust line 26. The gas exhaust unit 28 can decrease a pressure in a plasma processing space in the chamber 10 to a desired vacuum level. A gate valve 30 for opening/closing a loading/unloading port for the semiconductor wafer W is provided at an out side of the sidewall of the chamber 10.

A first high frequency power supply 32 and a second high frequency power supply 34 are electrically connected to the susceptor 12 via a matching unit 36 and a power supply rod 38. An electrode chuck 40 for holding the semiconductor wafer W is provided on a top surface of the susceptor 12. A focus ring 42 is provided at a radially outer side of the electrostatic chuck 40 to annularly surround the periphery of the semiconductor wafer W.

An upper electrode 64 of a ground potential serving as a shower head is attached, in an electrically floating state, to a ceiling portion of the chamber 10 through an annular insulator 65 while facing the susceptor 12 in parallel. The upper electrode 64 includes an electrode plate 66 facing the susceptor 12 and an electrode holder 68 for detachably holding the electrode plate 66 from its top side (upper side in FIG. 6). The electrode holder 68 serves as, e.g., a cooling plate, and suppresses temperature variation of the electrode plate 66.

A gas chamber 70 is provided inside the electrode holder 68. A plurality of gas injection holes 72 is formed through the electrode holder 68 and the electrode plate 66 from the gas chamber 70 toward the susceptor 12. A space between the electrode plate 66 and the susceptor 12 becomes a plasma generation space or a processing space PS. A gas supply line 75 from a processing gas supply unit 76 is connected to a gas inlet port 70a provided at an upper portion of the gas chamber 70. The electrode plate 66 is made of, e.g., Si or SiC, and the electrode holder 68 is made of, e.g., alumite-treated aluminum.

Plasma Processing Apparatus According to an Embodiment

An upper electrode assembly 110 of the plasma processing apparatus according to an embodiment will be described with reference to FIG. 1. FIG. 1 is a schematic view of the upper electrode assembly 110 of the plasma processing apparatus according to the embodiment. The upper electrode assembly 110 includes a mechanism for lifting the electrode plate to a cooling plate provided above the electrode plate. A configuration of the plasma processing apparatus according to the embodiment is substantially the same as that of the conventional plasma processing apparatus 100 shown in FIG. 6 except that there is provided the upper electrode assembly 110. The plasma processing apparatus according to the embodiment is configured such that an operator can manipulate the upper electrode assembly 110 from a lower side thereof.

The structure shown in FIG. 1 is an example of the structure of the upper electrode assembly 110 of the plasma processing apparatus according to the embodiment, which corresponds to the upper electrode 64 of the conventional plasma processing apparatus 100 shown in FIG. 6. FIG. 1 shows a cross section of a portion including a lifting mechanism 200 (to be described later) of the upper electrode assembly 110.

The upper electrode assembly 110 shown in FIG. 1 may be disposed at a desired position inside the chamber (corresponding to the chamber 10 shown in FIG. 6) of the plasma processing apparatus. However, it is unnecessary to dispose the upper electrode assembly 110 inside the chamber as shown in FIG. 6. For example, the wall surface of the chamber and the upper electrode assembly 110 may not be in contact with each other by allowing another structure to hold the upper electrode assembly 10 from the top.

As shown in FIG. 1, the upper electrode assembly 110 according to the embodiment includes an electrode plate 120 (hereinafter, may be referred to as "upper electrode"), a cooling plate 122, and an outer ring 124 (hereinafter, may be referred to as "sliding member"). The upper electrode assembly 110 serves as a shower head.

The electrode plate 120 is a disc-shaped member substantially corresponding to the electrode plate 66 shown in FIG. 6. A plurality of gas injection holes 121 is formed in the electrode plate 120 so that a processing gas can pass therethrough. The electrode plate 120 is made of, e.g., Si or SiC.

The cooling plate 122 is a disc-shaped member substantially corresponding to the electrode holder 68 shown in FIG. 6. Gas injection holes 126 are formed in the cooling plate 122. The gas injection holes 126 formed in the cooling plate 122 are connected to the gas injection holes 121 formed in the electrode plate 120 and communicate with a gas chamber 125 formed in the cooling plate 122. The gas chamber 125 has the same function as that of the gas chamber 70 shown in FIG. 6.

The cooling plate 122 is in surface contact with the top surface of the electrode plate 120 to control the temperature of the upper electrode assembly 110. The cooling plate 122 is made of a conductive material, e.g., aluminum having an alumite-treated surface. A heat transfer sheet may be interposed between the electrode plate 120 and the cooling plate 122 in order to increase a heat transfer efficiency. In that case, holes are formed at portions of the heat transfer sheet which correspond to the gas injection holes 121 formed in the electrode plate 120 and the gas injection holes 126 formed in the cooling plate 122.

The outer ring 124 is an annular member surrounding the outer periphery of the cooling plate 122. The outer ring 124 is engaged with the cooling plate 122 by a flange or the like provided at the outer periphery of the cooling plate 122. The type of engagement between the cooling plate 122 and the outer ring 124 is not particularly limited as long as the operation of the lifting mechanism 200 (see FIG. 2) to be described later is not disturbed.

Summary of the Lifting Mechanism 200

Figure 2:
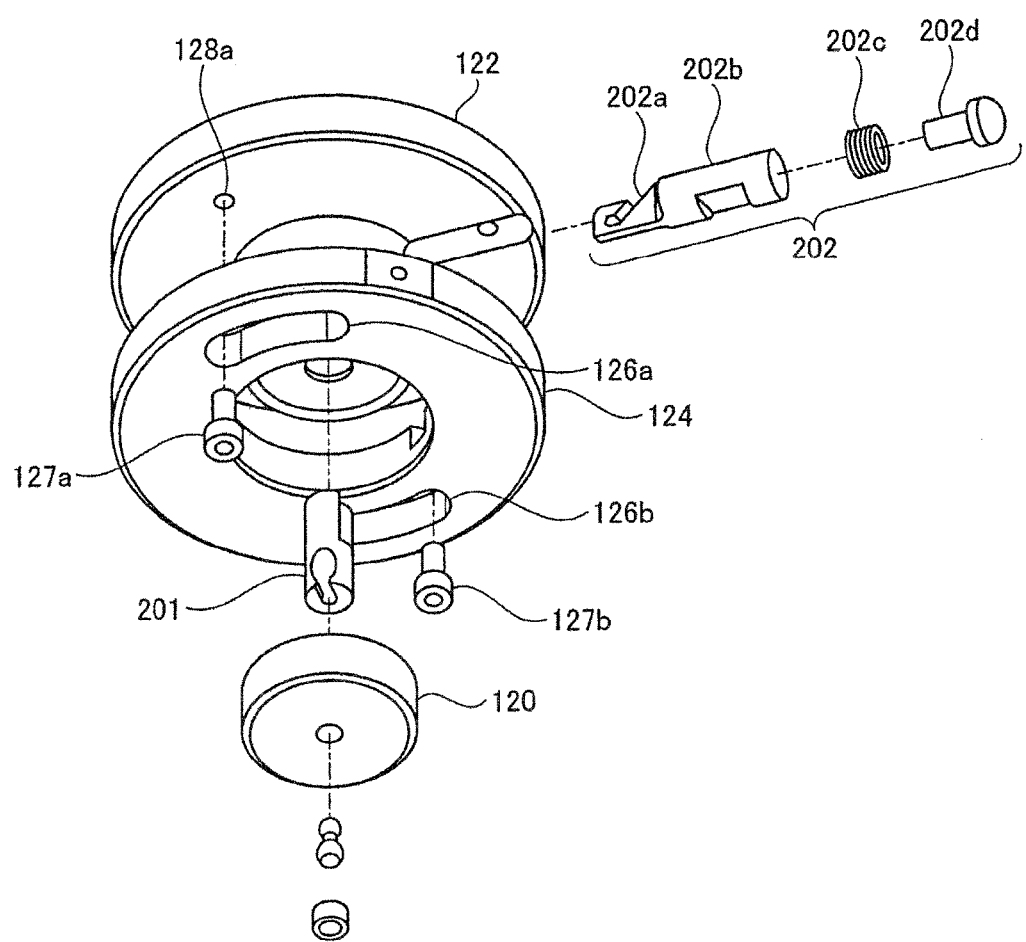
FIG. 2 is an exploded perspective view of a test model of a lifting mechanism according to the embodiment.

The lifting mechanism 200 of the upper electrode assembly 110 according to the embodiment will be described with reference to FIGS. 1 and 2. FIG. 2 is an exploded perspective view of a test model of the lifting mechanism 200 according to the embodiment. In FIG. 2, there is illustrated the test model in which the electrode plate 120, the cooling plate 122 and the outer ring 124 are formed in simple shapes for easy understanding. In the structure shown in FIG. 2, the electrode plate 120 supported by a supporting member 201 is illustrated as a substantially circular small plate-shaped member. The cooling plate 122 and the outer ring 124 are illustrated as a scaled-down disc-shaped member and a scaled-down ring-shaped member, respectively.

The lifting mechanism 200 can lift the electrode plate 120 to the bottom of the cooling plate 122 by the engagement of the electrode plate 120, the cooling plate 122 and the outer ring 124.

Specifically, the lifting mechanism 200 includes the supporting member 201, a connecting member 202, and a recess 205 (see FIGS. 4E, 4F and 5) formed at the outer ring 124.

As shown in FIG. 1, the supporting member 201 is inserted into a hole 300 formed in the electrode plate 120 in a vertical direction thereof (vertical direction in FIG. 1) and holds the electrode plate 120 in the vertical direction. The supporting member 201 has an opening 201a and an engaging part 201b at a central portion thereof (see FIG. 4D). The opening 201a has a size that allows insertion of a hook part 202a (hereinafter, may be referred to as "claw part", see FIG. 4A) of the connecting member 202 which will be described later. The engaging part 201b is formed so as to traverse an upper portion of the opening 201a. The engaging part 201b has a size that allows engagement of the hook part 202a of the connecting member 202 (see FIG. 3).

Figure 3:
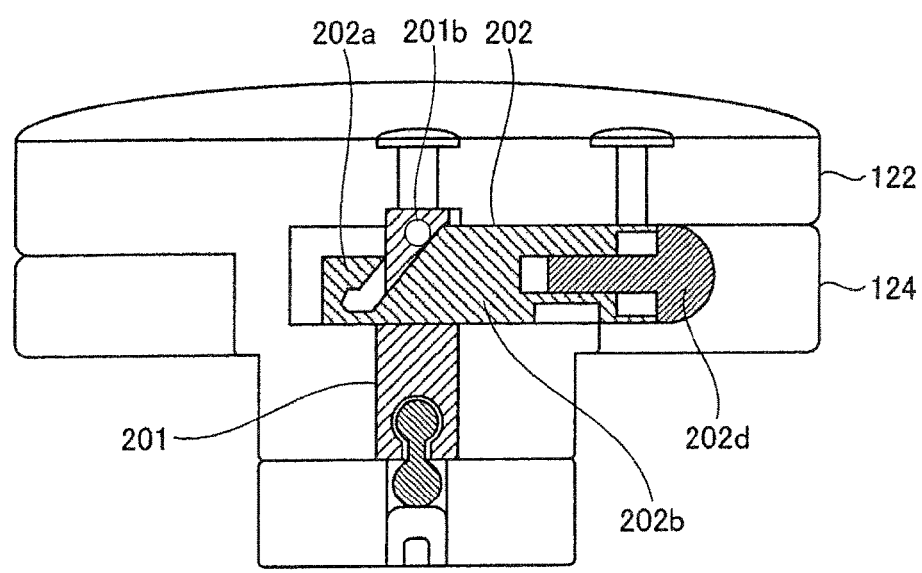
FIG. 3 is a schematic view of the test model of the lifting mechanism according to the embodiment.

The shape of the supporting member 201 is not particularly limited as long as the supporting member 201 can support the electrode plate 120 and has the opening 201a into which the hook part 202a can be inserted and the engaging part 201b with which the hook part 202a can be engaged. The supporting member 201 may be any member as long as it can support the electrode plate 120 in the vertical direction. As shown in FIGS. 2 and 3, for example, the supporting member 201 may be fixed to the electrode plate 120 by employing a structure in which a screw is fixed to a recess portion formed at a lower portion of the supporting member 201 and the opposite side of the screw is fixed with a socket.

The supporting member 201 reaches a hole 302 while penetrating through the hole 300 formed in the electrode plate 120 and a hole 301 formed in the cooling plate 122 in the vertical direction thereof. The holes 302 and 301 meet at a substantially right angle and communicate with each other. The hole 302 extends in a diametrical direction of the cooling plate 122 and opens on an outer peripheral surface of the cooling plate 122. Further, the hole 302 extends inward in the diametrical direction of the cooling plate 122 by a predetermined distance beyond the hole 301. The connecting member 202 is disposed inside the hole 302. The hole 301 extends upward in the vertical direction of the cooling plate 122 by a predetermined distance beyond the hole 302. The holes 301 and 302 may have lengths that allow the movements of the supporting member 201 and the connecting member 202 which will be described later.

The connecting member 202 has the hook part 202a, a shaft part 202b, a spring part 202c, and an end part 202d (see FIG. 2). It is unnecessary to form the components of the connecting member 202 as separate members. The components of the connecting member 202 may be formed as one unit.

The hook part 202a is formed at one end, in an axial direction, of the connecting member 202 which is close to the center of the cooling plate 122. The hook part 202a has a claw part and an inclined surface whose upper end is gradually increased toward the shaft part 202b. As described above, the hook part 202a is inserted into the opening 201a of the supporting member 201 and engaged with the engaging part 201b. When the hook part 202a is inserted into the opening 201a of the supporting member 201, the inclined surface of the hook part 202a is brought into contact with the engaging part 201b.

The shaft part 202b continues from the hook part 202a and extends outward in the diametrical direction of the cooling plate 122. The shaft part 202b is connected to the end part 202d via the spring part 202c. The connecting member 202 has a length that allows the end part 202d to protrude from the outer periphery of the cooling plate 122 by a predetermined distance when the connecting member 202 is disposed inside the hole 302. The end part 202d is insertion-fitted to the recess 205 formed at the outer ring 124 provided around the outer periphery of the cooling plate 122.

Figure 4A:
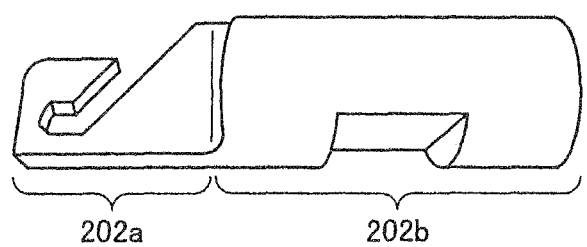
FIG. 4A is a perspective view of an example of a part of a connecting member of the lifting mechanism according to the embodiment.
Figure 4B:
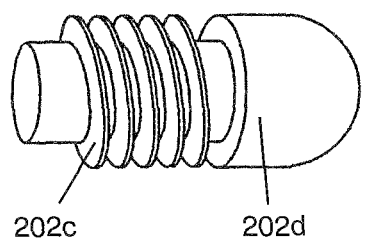
FIG. 4B is a perspective view of an example of another part of the connecting member of the lifting mechanism according to the embodiment.
Figure 4C:
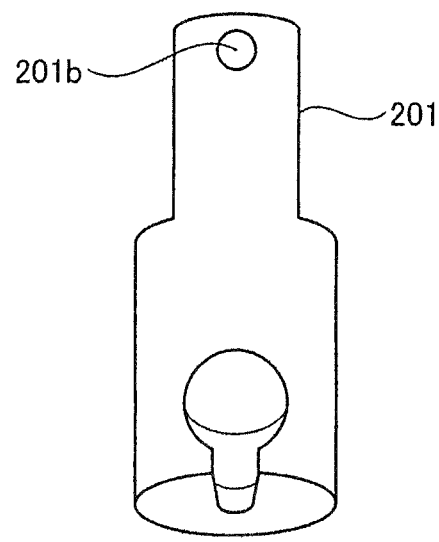
FIG. 4C is a perspective view of an example of a supporting member of the lifting mechanism according to the embodiment which is seen from a predetermined angle.
Figure 4D:
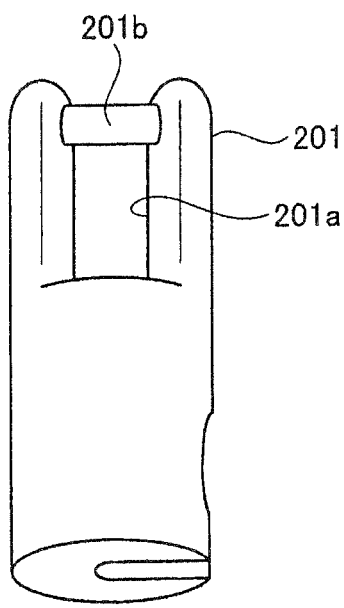
FIG. 4D is a perspective view of an example of a supporting member of the lifting mechanism according to the embodiment which is seen from another angle.
Figure 4E:
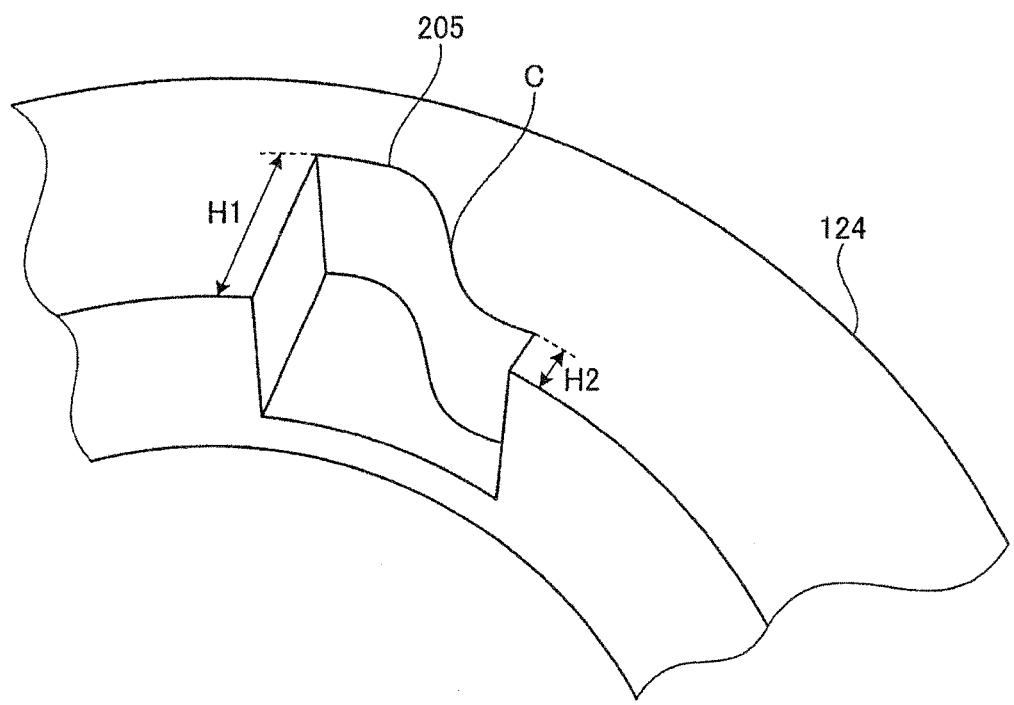
FIG. 4E is a perspective view of an example of a recess of an outer ring of the lifting mechanism according to the embodiment.
Figure 4F:
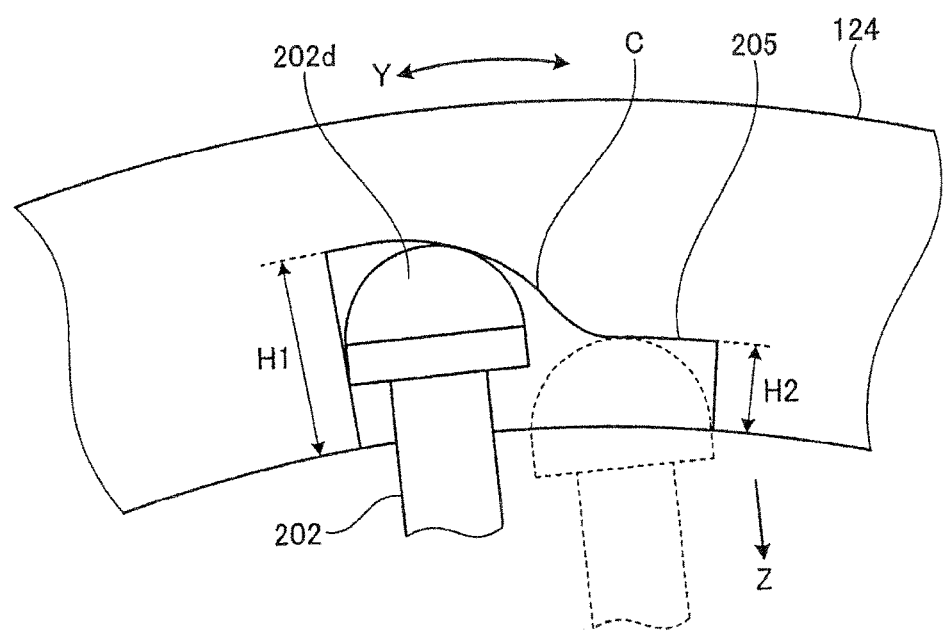
FIG. 4F is a top view for explaining the example of the recess of the outer ring of the lifting mechanism according to the embodiment.

The recess 205 is a groove formed on an inner peripheral surface of the outer ring 124 (see FIGS. 4E and 4F). The recess 205 has a curved surface C spaced from the center of the cooling plate 122 by a gradually changing distance (see FIGS. 4E and 4F). The distance from the center of the cooling plate 122 to the curved surface C is changed in at least two steps H1 and H2 (H2<H1).

Assembly Example of the Lifting Mechanism 200

An engagement relation among the components of the lifting mechanism 200 will be described by using an assembly example.

First, the supporting member 201 is inserted into the hole 300 formed in the electrode plate 120 and supports the electrode plate 120. Next, a part of the supporting member 201 which protrudes upward beyond the electrode plate 120 is inserted into the hole 301 formed in the cooling plate 122. Then, the connecting member 202 is inserted into the hole 302 extending inward in the diametrical direction of the cooling plate 122 from the outer periphery to the center thereof. The hook part 202a of the inserted connecting member 202 passes through the opening 201a of the supporting member 201 and extends toward the radially inner end of the hole 302 which is close to the center of the cooling plate 122. At this time, a clearance having at least a length of (H1-H2) exists between the end of the hook part 202a and the end of the hole 302 which is close to the center of the cooling plate 122.

In that state, the outer ring 124 is attached to the outer periphery of the cooling plate 122. At this time, an end (the end part 202d side) in a circumferential direction of the connecting member 202 is brought into contact with a portion on the curved surface C of the recess 205 of the outer ring 124 which is spaced from the center of the cooling plate 122 by the length H1 (i.e., a portion positioned at a large distance). A guide for guiding the connecting member 202 may be provided at the outer ring 124.

Next, the outer ring 124 is rotated in the circumferential direction along the outer periphery of the cooling plate 122 (see a direction of an arrow Y in FIG. 4F). As the outer ring 124 is rotated, the end part of the connecting member 202 which is in contact with the curved surface C of the recess 205 of the outer ring 124 gradually slides from the portion with the length H1 toward a portion with the length H2. As the position of the curved surface C which is brought into contact with the end part of the connecting member 202 is changed, the connecting member 202 is gradually pushed toward the center of the cooling plate 122 (see a direction of an arrow Z in FIG. 4F). Accordingly, the inclined surface of the hook part 202a which is brought into contact with the engaging part 201b of the supporting member 201 slides, thereby gradually lifting the supporting member 201. Lastly, the end part of the connecting member 202 is stopped at the portion with the length H2 and, at that moment, the supporting member 201 is lifted to a predetermined position. Accordingly, the clamping between the supporting member 201 and the connecting member 202, i.e., the clamping between the electrode plate 120 and the cooling plate 122, is completed.

Details of the Components of the Lifting Mechanism 200

Hereinafter, details of the lifting mechanism 200 will be further described with reference to FIGS. 2 to 4F. FIG. 3 is a schematic view of a test model of the lifting mechanism 200 according to the embodiment. FIG. 4A is a perspective view of an example of a part of the connecting member 202 of the lifting mechanism 200 according to the embodiment. FIG. 4B is a perspective view of an example of another part of the connecting member 202 of the lifting mechanism 200 according to the embodiment. FIG. 4C is a perspective view of an example of the supporting member 201 of the lifting mechanism 200 according to the embodiment, which is seen at a predetermined angle. FIG. 4D is a perspective view of an example of the supporting member 201 of the lifting mechanism 200 according to the embodiment which is seen from another angle. FIG. 4E is a perspective view of an example of the recess 205 of the outer ring 124 of the lifting mechanism 200 according to the embodiment. FIG. 4F is a top view for explaining the example of the recess 205 of the outer ring 124 of the lifting mechanism 200 according to the embodiment.

The test model shown in FIGS. 2 and 3 is obtained by modelling only parts of the electrode plate 120 and the cooling plate 122 which constitute the lifting mechanism 200. The structure shown in FIGS. 2 and 3 substantially corresponds to the right half of the structure shown in FIG. 1. In FIGS. 2 and 3, like reference numerals are given to the same or corresponding parts as those of FIG. 1, for convenience of explanation.

In the example shown in FIGS. 2 and 3, the cooling plate 122 has a central portion slightly extending downward. The outer ring 124 surrounds the downwardly extending portion. Further, in the example shown in FIG. 2, the cooling plate 122 and the outer ring 124 are configured as members having the same outer circumference. Therefore, an opening into which the connecting member 202 is inserted toward the inner side (central side) of the cooling plate 122 is formed as a groove at an outer peripheral portion of the cooling plate 122.

In order to restrict a rotation angle, grooves 126a and 126b and studs 127a and 127b to be respectively engaged with the grooves 126a and 126b are formed at the outer ring 124. The studs 127a and 127b are engaged with sockets formed at the cooling plate 122 (only a socket 128a is shown in FIG. 2). The components shown in FIGS. 2 and 3 have functions same as those of the components of the lifting mechanism 200 shown in FIG. 1.

The components of the lifting mechanism 200 may have the shapes shown in FIGS. 4A to 4F, for example. However, the shapes shown in FIGS. 4A to 4F are only an example, and they may be properly changed as long as the above-described operations and functions are not disturbed. For example, parts (the hook part 202a and the shaft part 202b) of the connecting member 202 shown in FIG. 4A may be formed as one unit with the other parts of the connecting member 202. The cut-off portion of the bottom surface of the shaft part 202b shown in FIG. 4A may be omitted.

The shapes of the other parts (the spring part 202c and the end portion 202d) of the connecting member 202 shown in FIG. 4B are not limited to those shown in FIG. 4B. In FIGS. 4A and 4B, the connecting member 202 has a shaft and a ball cam (end portion 202d). However, the shape of the connecting member 202 is not limited thereto and may be properly changed as long as it can push the supporting member 201 upward in cooperation with a mechanism provided at the outer ring 124.

The supporting member 201 shown in FIGS. 4C and 4D has at a lower portion thereof a circular hollow part into which a screw having a spherical end is inserted as shown in FIG. 3. The opening 201a has a shape surrounded by two substantially cylindrical axes extending in the vertical direction, the substantially cylindrical engaging part 201b, and the lower cylindrical portion. However, the shape of the supporting member 201 is not limited thereto and may be modified as long as it can function as described above.

FIGS. 4E and 4F show an example of the recess 205. As shown in FIG. 4E, the recess 205 has a curved surface C. One end of the curved surface C is spaced from the inner peripheral surface of the outer ring 124 by the length H1 and the other end of the curved surface C is spaced from the inner peripheral surface of the outer ring 124 by the length H2. As shown in FIG. 4F, the end part 202d of the connecting member 202 is engaged with the end portion of the recess 205 which has the length H1. Next, the outer ring 124 is rotated in a direction of the arrow Y, so that the end part 202d slides toward the end portion of the recess 205 which has the length H2. As a result, the connecting member 202 is pushed in the direction of the arrow Z.

The shapes of the recess 205 and the end part 202d are not limited to those shown in FIGS. 4E and 4F. The shapes of the recess 205 and the end part 202d may vary as long as the connecting member 202 can be pushed toward the center of the cooling plate 122 by the rotation of the outer ring 124 as shown in FIGS. 4E and 4F.

Configuration Example of the Cooling Plate 122

Figure 5:
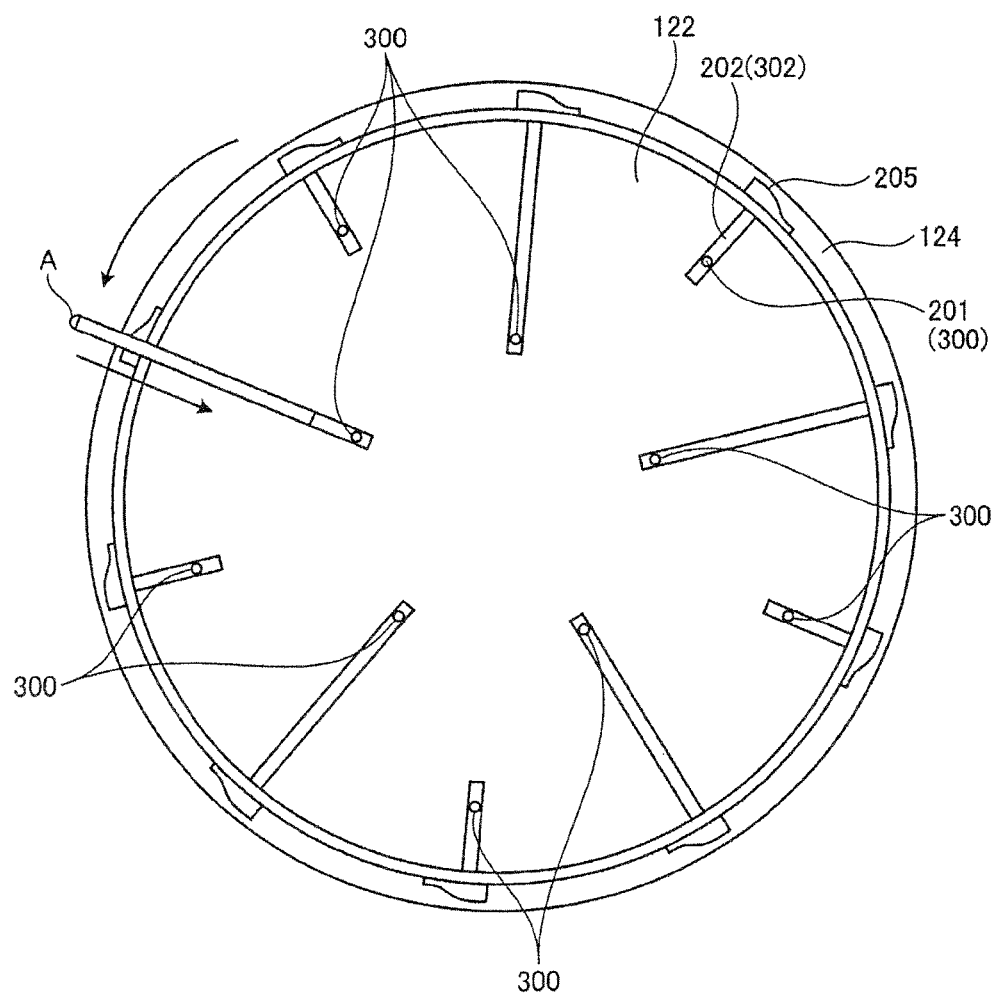
FIG. 5 is a schematic view of a cooling plate which explains arrangement of components of the lifting mechanism according to the embodiment.

An example of a configuration of the cooling plate 122 assembled with the lifting mechanism 200 of the present embodiment will be described with reference to FIG. 5. FIG. 5 is a schematic view of the cooling plate 122 which explains the arrangement of the components of the lifting mechanism 200 according to the embodiment.

In FIG. 5, holes 300 through which the supporting members 201 are inserted are formed at ten locations on the cooling plate 122. In the embodiment, the electrode plate 120 is lifted by the supporting members 201 at locations close to the center of the cooling plate 122 as well as locations close to the circumference of the cooling plate 122. Since the electrode plate 120 is lifted by the supporting members 201 provided at multiple locations in the radial direction of the cooling plate 122, the decrease in the contact pressure between the cooling plate 122 and the electrode plate 120 is prevented even after the upper electrode is consumed. Accordingly, the temperature performance can be improved.

The lifting locations are not limited to the ten locations shown in FIG. 5. For example, in the case of interposing a heat transfer sheet between the cooling plate 122 and the electrode plate 120, it is preferable to enhance the clamping force by increasing the number of lifting locations. The lifting locations are not limited to those spaced from each other at a substantially regular interval on a plurality of concentric circles as shown in FIG. 5. For example, the lifting locations may be changed depending on, e.g., the position of the gas chamber 125 or the positions of the gas injection holes in the cooling plate 122, the weight of the cooling plate 122, the weight of the electrode plate 120, and the like.

FIG. 5 shows a state in which the outer ring 124 is engaged with the cooling plate 122 into which the supporting member 201 and the connecting member 202 are inserted. The connecting member 202 indicated by a notation A in an upper left side of FIG. 5 is illustrated as a member longer than the other connecting members 202, for convenience of explanation. As shown in FIG. 5, the length of the connecting member 202 is determined by a distance from the lifting location where the supporting member 201 is inserted to the circumference of the cooling plate 122. In the example shown in FIG. 5, five connecting members 202 have lengths longer than those of the other five connecting members 202. Further, the connecting member 202 penetrates through the circumference of the cooling plate 122 and is brought into contact with the recess 205 of the outer ring 124 (which is not shown). In the example shown in FIG. 5, by rotating the outer ring 124 in a counterclockwise direction, the contact position between the connecting members 202 and the recesses 205 are changed and the connecting members 202 are pushed toward the center of the cooling plate 122. As the connecting members 202 are moved, the engaging parts 201b can be pushed upward by the upper ends of the hook parts 202a. Accordingly, the electrode plate 120 is clamped to the cooling plate 122. After the clamping between the electrode plate 120 and the cooling plate 122 is completed by the completion of the rotation of the outer ring 124, the outer ring 124 is screwed and fixed to the cooling plate 122. As a result, the lifting operation is completed.

Since a plurality of connecting members 202 having different lengths are used, two types of holes 302 having different lengths are formed in the cooling plate 122. By arranging the lifting locations at multiple locations spaced from the circumference or the center of the cooling plate 122 by different distances, it is possible to prevent the central portion of the electrode plate 120 from being hung down by the consumption of the upper electrode.

Effect of the Embodiment

As described above, the plasma processing apparatus and the upper electrode assembly according to the embodiment include: the supporting member 201, partially disposed in the disc-shaped cooling plate 122, for supporting the upper electrode 120 in a direction of gravity; the connecting member 202, partially disposed in the cooling plate 122, extending in the diametrical direction of the cooling plate 122 to be engaged with the supporting member 201; the sliding member 124 for sliding the connecting member 202 inward in the diametrical direction of the cooling plate 122 so that the supporting member 201 is lifted upward and the upper electrode 120 is lifted to the cooling plate 122. With this configuration, the plasma processing apparatus according to the embodiment can flexibly control the lifting force of the upper electrode 120 by devising the shapes of the supporting member 201, the connecting member 202 and the sliding member 124. Further, the plasma processing apparatus according to the embodiment can improve the temperature variation of the upper electrode 120 by clamping the cooling plate 122 and the electrode plate 120 by using the supporting member 201, the connecting member 202 and the sliding member 124.

In the plasma processing apparatus according to the embodiment, the sliding member 124 slides the connecting member 202 while rotating on the outer periphery of the cooling plate 122. Therefore, the plasma processing apparatus according to the embodiment can lift the upper electrode 120 to the cooling plate 122 by using a simple configuration.

In the plasma processing apparatus according to the embodiment, the connecting member 202 has the hook part 202a to be engaged with the supporting member 201, the hook part 202a being disposed close to the center of the cooling plate 122 and having an inclined upper surface. Therefore, the plasma processing apparatus according to the embodiment can lift the upper electrode 120 to the cooling plate 122 by using a simple configuration.

In the plasma processing apparatus according to the embodiment, the connecting member 202 has the shaft and the ball cam. Therefore, the plasma processing apparatus according to the embodiment can finely control the lifting force by using the shaft and the ball cam. In the plasma processing apparatus according to the embodiment, the supporting member 201 has the opening 201a through which the hook part 202a of the connecting member 202 passes. Therefore, the plasma processing apparatus according to the embodiment can perform the operation of lifting the electrode plate 120 to the cooling plate 122 without separation of the supporting member 201 after the engagement between the supporting member 201 and the connecting member 202.

In the plasma processing apparatus according to the embodiment, as the opening 201a of the supporting member 201 is moved along the inclined surface of the hook part 202a of the connecting member 202, the supporting member 201 can be lifted upward in the vertical direction of the electrode plate 120. Therefore, the plasma processing apparatus according to the embodiment can lift the electrode plate 120 to the cooling plate 122 by using the connecting member 202 and the supporting member 201 of simple structures.

In the plasma processing apparatus according to the embodiment, the sliding member 124 has the recess 205 to be engaged with the end part of the connecting member 202 and extending in the circumferential direction of the cooling plate 122, and the connecting member 202 slides inward in the diametrical direction of the cooling plate 122 by the movement of the end part from a first end to a second end in the circumferential direction of the recess by the rotation of the sliding member 124. Therefore, the plasma processing apparatus according to the embodiment can lift the electrode plate 120 to the cooling plate by using a simple configuration and a simple operation.

In the plasma processing apparatus according to the embodiment, the supporting members 201 are arranged on at least two concentric circles that are coaxial with the cooling plate 122 and the connecting members 202 to be respectively engaged with the supporting members 201 are slid by one sliding member 124. Therefore, in the plasma processing apparatus according to the embodiment, the cooling plate 122 can lift the upper electrode 120 thereto uniformly and simultaneously at multiple locations. Since the cooling plate 122 and the upper electrode 120 are clamped at multiple locations, the decrease in the interface pressure between the upper electrode 120 and the cooling plate 122 can be suppressed even when the upper electrode 120 is consumed. Therefore, it is possible to suppress variation of an etching rate, variation of a temperature of the upper electrode 120 or the like.

Other Embodiments

While the plasma processing apparatus and the upper electrode assembly according to the embodiment have been described, various modifications can be made within the scope of the disclosure.

For example, the supporting member 201 may have a spherical end portion so that it can respond to thermal expansion. In addition, an axial force may be changed by misaligning positions of springs forming the spring part 202c. The axial force may also be controlled by controlling the length of the connecting member 202 (the shaft part 202b).

The upper electrode assembly 110 according to the embodiment may be disposed in the chamber so that it is possible to rotate the outer ring 124 from a lower side. In that case, the exchange operation can be performed by separating the electrode plate 120 by rotating the outer ring 124 without separating other components of the plasma processing apparatus.

The locations or the number of the supporting members 201 may be appropriately changed based on the size or the weight of the cooling plate 122 and the electrode plate 120.

While the disclosure has been shown and described with respect to the embodiments, it will be understood by those skilled in the art that various changes and modifications may be made without departing from the scope of the disclosure as defined in the following claims.

What is claimed is:

1. A plasma processing apparatus comprising:
supporting members each of which is partially disposed in a disc-shaped cooling plate and configured to support an upper electrode in a direction of gravity;
connecting members each of which is partially disposed in the cooling plate and extends in a diametrical direction of the cooling plate to be engaged with the corresponding supporting member; and
a sliding member configured to slide the connecting members inward in the diametrical direction of the cooling plate, thereby pushing upward the supporting members and lifting the upper electrode to the cooling plate.

2. The plasma processing apparatus of claim 1, wherein the sliding member rotates on an outer periphery of the cooling plate, thereby sliding the connecting members.

3. The plasma processing apparatus of claim 1, wherein each of the connecting members has a hook part to be engaged with the corresponding supporting member, the hook part having an upper inclined surface.

4. The plasma processing apparatus of claim 1, wherein each of the connecting members has a shaft and a ball cam.

5. The plasma processing apparatus of claim 3, wherein the supporting member has an opening through which the hook part of the connecting member passes.

6. The plasma processing apparatus of claim 5, wherein the supporting member further has an engaging part formed so as to traverse an upper portion of the opening, and the supporting member is lifted upward in a direction perpendicular to the cooling plate as the engaging part of the supporting member is relatively moved along the inclined surface of the hook part of the connecting member.

7. The plasma processing apparatus of claim 1, wherein the sliding member has recesses each of which is engaged with an end part of the corresponding connecting member and extending in a circumferential direction of the cooling plate, and
wherein the connecting member slides inward in the diametrical direction of the cooling plate by the movement of the end part from a first end to a second end in the circumferential direction of the recess by the rotation of the sliding member.

8. The plasma processing apparatus of claim 1, wherein the supporting members are provided on at least two concentric circles that are coaxial with the cooling plate and the connecting members to be engaged with the corresponding supporting members are slid by the rotation of the sliding member.

9. An upper electrode assembly comprising:
supporting members each of which is partially disposed in a disc-shaped cooling plate and configured to support an upper electrode in a direction of gravity;
connecting members each of which is partially disposed in the cooling plate and extends in a diametrical direction of the cooling plate to be engaged with the corresponding supporting member; and
a sliding member configured to slide the connecting members inward in the diametrical direction of the cooling plate, thereby pushing upward the supporting members and lifting the upper electrode to the cooling plate.

* * * * *